(12) United States Patent
Miyoshi (10) Patent No.: US 7,765,660 B2
(45) Date of Patent: Aug. 3, 2010

(54) METHOD OF MANUFACTURING A MULTILAYERED PIEZOELECTRIC ELEMENT HAVING INTERNAL ELECTRODES AND SIDE ELECTRODES

(75) Inventor: Tetsu Miyoshi, Kaisei-machi (JP)

(73) Assignee: FUJIFILM Corporation, Tokyo (JP)

( * ) Notice: Subject to any disclaimer, the term of this patent is extended or adjusted under 35 U.S.C. 154(b) by 69 days.

(21) Appl. No.: 12/126,459

(22) Filed: May 23, 2008

(65) Prior Publication Data

US 2008/0222866 A1  Sep. 18, 2008

Related U.S. Application Data

(62) Division of application No. 11/604,699, filed on Nov. 28, 2006, now abandoned.

(30) Foreign Application Priority Data

Nov. 28, 2005  (JP) .............................. 2005-342915

(51) Int. Cl.
  *H01L 41/22* (2006.01)
(52) U.S. Cl. ........................ 29/25.35; 29/25.42; 29/831; 29/592.1; 310/311; 310/328
(58) Field of Classification Search ..... 29/25.35–25.42, 29/831, 846–847, 592.1, 594; 310/328, 358, 310/311, 334; 361/306.3, 311, 329, 322; 438/113, 458, 462
  See application file for complete search history.

(56) References Cited

U.S. PATENT DOCUMENTS

| 4,845,399 A | 7/1989 | Yasuda et al. |
| 5,945,770 A | 8/1999 | Hanafy |
| 6,166,006 A | 12/2000 | Shiraishi et al. |
| 6,452,312 B1 | 9/2002 | Hanaki et al. |
| 6,774,542 B2 | 8/2004 | Anasako |
| 6,784,600 B2 | 8/2004 | Klee et al. |
| 6,800,984 B2 | 10/2004 | Marth |
| 6,891,313 B1 | 5/2005 | Henneken et al. |
| 7,054,135 B2 * | 5/2006 | Kuniyasu ................. 361/306.3 |
| 7,126,261 B2 | 10/2006 | Shibata et al. |
| 7,156,938 B2 * | 1/2007 | Baumgartner et al. ....... 156/150 |
| 7,268,017 B2 * | 9/2007 | Osawa ........................ 438/113 |
| 7,581,295 B2 * | 9/2009 | Miyoshi ..................... 29/25.35 |
| 2003/0168945 A1 | 9/2003 | Birgel |

FOREIGN PATENT DOCUMENTS

| JP | 60-121784 | 6/1985 |
| JP | 3185884 | 8/1991 |
| JP | 3224281 | 10/1991 |
| JP | 3155176 | 7/1993 |

(Continued)

*Primary Examiner*—Minh Trinh
(74) *Attorney, Agent, or Firm*—Sughrue Mion, PLLC (57) ABSTRACT

A method of manufacturing a multilayered piezoelectric element having a multilayered structure by which an internal electrode and a side electrode are strongly connected. The method includes the steps of: forming first and second side surfaces by dicing the multilayered structure to protrude end portions of first and second electrode layers to an outer side than adjacent piezoelectric material layers and secure insulating regions between each electrode layer and respective one side surface; and forming a first side electrode on the first side surface and a second side electrode on the second side surface.

10 Claims, 6 Drawing Sheets

FOREIGN PATENT DOCUMENTS

| | | |
|---|---|---|
| JP | 7086655 | 3/1995 |
| JP | 7226543 | 8/1995 |
| JP | 11195818 | 7/1999 |
| JP | 2003-046157 | 2/2003 |
| JP | 2004-87730 | 3/2004 |
| JP | 2004-095593 | 3/2004 |
| JP | 2004-103621 | 4/2004 |
| JP | 2006-245594 | 9/2006 |
| WO | WO-2001-001499 | 1/2001 |

\* cited by examiner

METHOD OF MANUFACTURING A MULTILAYERED PIEZOELECTRIC ELEMENT HAVING INTERNAL ELECTRODES AND SIDE ELECTRODES

This is a divisional of application Ser. No. 11/604,699 filed Nov. 28, 2006 now abandoned. The entire disclosure(s) of the prior application(s), application Ser. No. 11/604,699 is hereby incorporated by reference.

BACKGROUND OF THE INVENTION

1. Field of the Invention

The present invention relates to a piezoelectric element having a multilayered structure, i.e., a multilayered piezoelectric element to be used as a piezoelectric actuator, an ultrasonic transducer and so on, and a method of manufacturing the multilayered piezoelectric element.

2. Description of a Related Art

A piezoelectric material represented by a material having a lead-based perovskite structure such as PZT (Pb (lead) zirconate titanate) provides a piezoelectric effect of expanding and contracting when applied with a voltage. A piezoelectric element having the property is utilized in various uses such as piezoelectric pumps, piezoelectric actuators and ultrasonic transducers. The basic structure of a piezoelectric element is a single-layer structure in which two electrodes are formed on both ends of one piezoelectric material. Accompanied with microfabrication and integration of piezoelectric elements with recent developments of MEMS (micro electro mechanical systems) related devices, multilayered piezoelectric elements each having plural piezoelectric materials and plural electrodes alternately stacked have been used.

Figure 7:
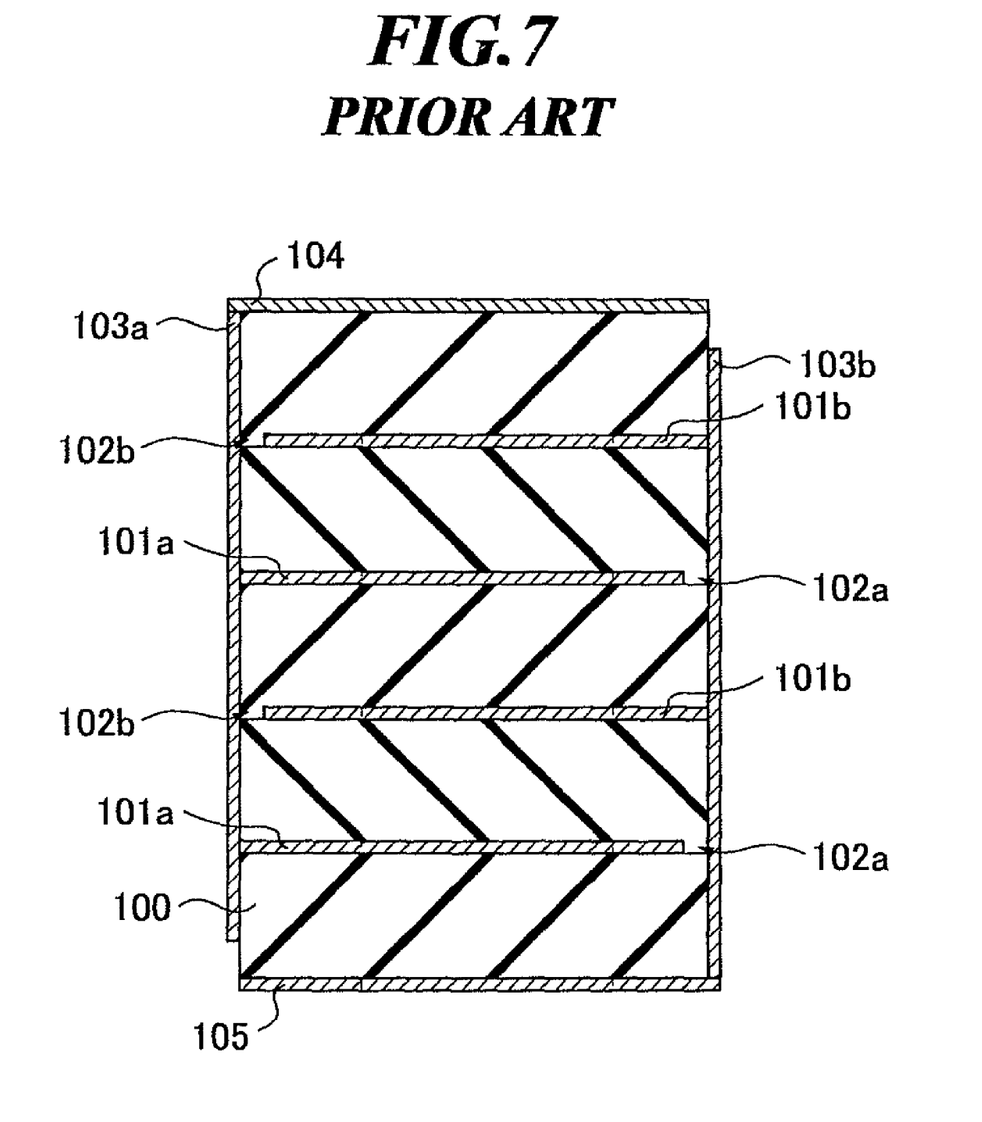
FIG. 7 is a sectional view showing a structure of a conventional multilayered piezoelectric element.

FIG. 7 is a sectional view showing a structure of a conventional multilayered piezoelectric element. This piezoelectric element includes a multilayered structure having alternately stacked piezoelectric material layers 100 and internal electrode layers 110a and 101b, side electrodes 103a and 103b, an upper electrode 104 and a lower electrode 105. Insulating regions 102a and 102b are provided in the internal electrode layers 110a and 101b, respectively.

The side electrode 103a is connected to the internal electrode layers 110a and insulated from the internal electrode layers 101b by the insulating regions 102b. Further, the side electrode 103b is connected to the internal electrode layers 101b and insulated from the internal electrode layers 110a by the insulating regions 102a. Furthermore, the upper electrode layer 104 is connected to the side electrode 103a, and the lower electrode layer 105 is connected to the side electrode 103b.

By forming the electrodes of the piezoelectric element in the above-mentioned manner, electrodes for applying electric fields to each of the piezoelectric material layers 100 are connected in parallel. Thereby, a capacitance between the electrodes of the multilayered structure as a whole becomes larger, and the rise in electrical impedance can be suppressed even when the size of the piezoelectric element is made smaller.

Further, instead of providing the insulating regions 102a and 102b in the internal electrode layers 110a and 101b as shown in FIG. 7, there is known a multilayered piezoelectric element in which each internal electrode layer is formed on an entire surface of respective one of the piezoelectric material layers and the internal electrode layer is insulated from either one of the side electrodes by forming an insulating film on an end surface of the internal electrode layer at a side surface of the multilayered structure.

However, in the multilayered piezoelectric element as shown in FIG. 7, there has been a problem that separation easily occurs in the connection region between the internal electrode layer and the side electrode. The reason is that, when the piezoelectric material layers expand and contract, the side electrodes are unable to follow the displacement of the piezoelectric material layers, and therefore, distortion is produced at the interface between the side electrode and the multilayered structure. Further, in the multilayered piezoelectric element having the insulating films formed on the side surfaces of the multilayered structure, the insulating films are apt to separate from the end surfaces of the internal electrodes for the same reason. Accordingly, there are problems that the reliability at the time of operation of piezoelectric element is low and the life of the element is short.

SUMMARY OF THE INVENTION

The present invention has been achieved in view of the above-mentioned problems. A purpose of the present invention is to prevent, in a multilayered piezoelectric element having a multilayered structure, separation of side electrodes or insulating films formed on side surfaces of the multilayered structure from end surfaces of internal electrodes.

In order to achieve the above-mentioned purpose, a multilayered piezoelectric element according to one aspect of the present invention is a multilayered piezoelectric element having a multilayered structure in which at least one first electrode layer and at least one second electrode layer are alternately stacked with a piezoelectric material layer therebetween, and includes: plural piezoelectric material layers; a first electrode layer having an end portion at least a part of which protrudes to an outer side than adjacent piezoelectric material layers on a first side surface of the multilayered structure, and formed such that a first insulating region is provided between the first electrode layer and a second side surface of the multilayered structure; a second electrode layer having an end portion at least a part of which protrudes to an outer side than adjacent piezoelectric material layers on the second side surface of the multilayered structure, and formed such that a second insulating region is provided between the second electrode layer and the first side surface of the multilayered structure; a first side electrode formed on the first side surface of the multilayered structure, connected to the at least a part of the end portion of the first electrode layer, and insulated from the second electrode layer by the second insulating region; and a second side electrode formed on the second side surface of the multilayered structure, connected to the at least a part of the end portion of the second electrode layer, and insulated from the first electrode layer by the first insulating region.

Further, a method of manufacturing a multilayered piezoelectric element according to one aspect of the present invention is a method of manufacturing a multilayered piezoelectric element having a multilayered structure in which at least one first electrode layer and at least one second electrode layer are alternately stacked with a piezoelectric material layer therebetween, and includes the steps of: (a) forming a first piezoelectric material layer; (b) forming a first electrode layer on the first piezoelectric material layer except for a predetermined region; (c) forming a second piezoelectric material layer on the first electrode layer; (d) forming a second electrode layer on the second piezoelectric material layer except for a predetermined region; (e) forming a third piezoelectric material layer on the second electrode layer; (f) forming a first side surface and a second side surface by dicing the formed multilayered structure to protrude at least a part of an end portion of the first electrode layer to an outer side than adjacent piezoelectric material layers on the first side surface and secure a first insulating region between the first electrode layer and the second side surface, and to protrude at least a part of an end portion of the second electrode layer to an outer side than adjacent piezoelectric material layers on the second side surface and secure a second insulating region between the second electrode layer and the first side surface; (g) forming a first side electrode, which is connected to the at least a part of the end portion of the first electrode layer and insulated from the second electrode layer by the second insulating region, on the first side surface of the multilayered structure; and (h) forming a second side electrode, which is connected to the at least a part of the end portion of the second electrode layer and insulated from the first electrode layer by the first insulating region, on the second side surface of the multilayered structure.

According to the present invention, the internal electrode is formed to have the end portion at least a part of which protrudes to the outer side than the adjacent piezoelectric material layers such that the internal electrode and the side electrode or the insulating film are connected to each other in a broad contact area. Thereby, the connection strength between the internal electrode and the side electrode or the insulating film is improved, and it becomes difficult for the side electrode or the insulating electrode to separate from the internal electrode even when the piezoelectric material layers expand and contract. As a result, the reliability of the operation of piezoelectric element can be improved and the lives of the piezoelectric element and equipment having the piezoelectric element can be made longer.

DESCRIPTION OF THE PREFERRED EMBODIMENTS

Hereinafter, preferred embodiments of the present invention will be explained in detail by referring to the drawings. The same reference numerals are assigned to the same component elements and the description thereof will be omitted.

Figure 1:
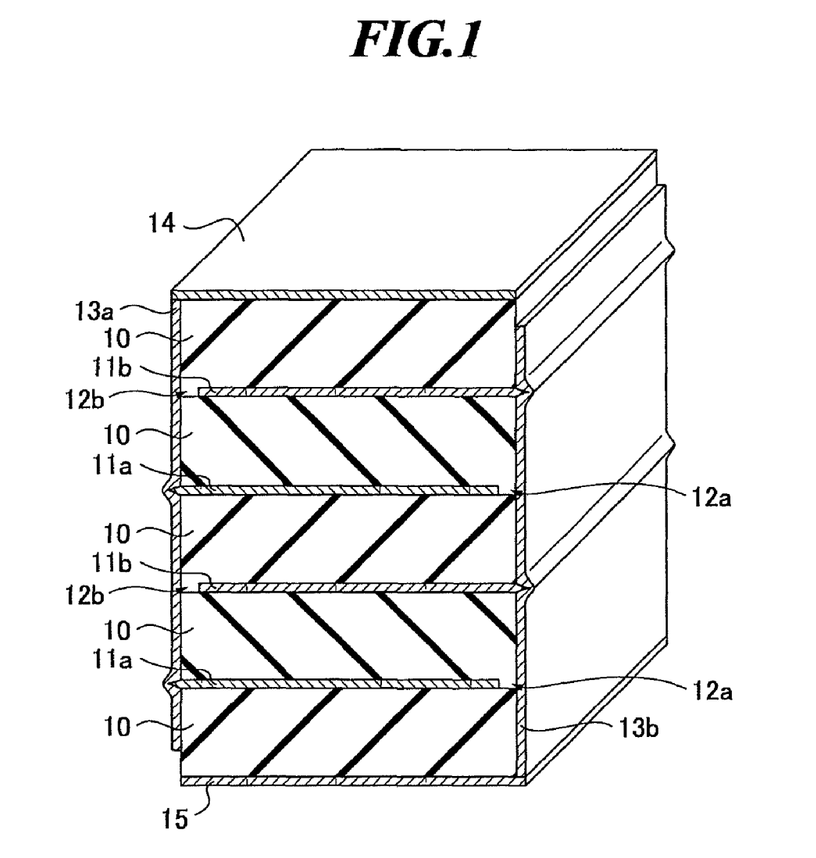
FIG. 1 is a partially sectional perspective view showing a structure of a multilayered piezoelectric element according to the first embodiment of the present invention.

FIG. 1 is a partially sectional perspective view showing a structure of a multilayered piezoelectric element according to the first embodiment of the present invention.

As shown in FIG. 1, the multilayered piezoelectric element according to the embodiment is a columnar structure having a bottom surface with sides of about 200 μm to 1 mm and a height of about 300 μm to 1 mm, for example. The multilayered piezoelectric element has (i) a multilayered structure including plural piezoelectric material layers 10, at least one internal electrode layer 11a and at least one internal electrode layer 11b, and (ii) side electrodes 13a and 13b formed on a first side surface and a second side surface of the multilayered structure, respectively. Generally, the multilayered piezoelectric element further has an upper electrode layer 14 and a lower electrode layer 15.

The at least one internal electrode layer 11a and at the least one internal electrode layer 11b are alternately stacked with the piezoelectric material layer 10 therebetween. The piezoelectric material layer 10 has a thickness of, for example, about 100 μm, and is formed of a compound oxide having a lead-based perovskite structure such as PZT (Pb(lead) zirconate titanate). Although five piezoelectric material layers 10, two internal electrode layers 11a and two internal electrode layers 11b are shown in FIG. 1, the number of piezoelectric material layers may be at least three, or six or more. The piezoelectric material layer 10 has a dense and hard tissue because it has been formed according to an aerosol deposition method, which will be described later.

Each of the internal electrode layers 11a and 11b has a thickness of about 3 μm, for example. Insulating regions 12a are provided between the internal electrode layers 11a and the side electrode 13b, and insulating regions 12b are provided between the internal electrode layers 11b and the side electrode 13a. Further, at least a part of the end portion of the internal electrode layer 11a protrudes to the outer side than the adjacent piezoelectric material layers 10 at the side of the side electrode 13a, while at least a part of the end portion of the internal electrode layer 11b protrudes to the outer side than the adjacent piezoelectric material layers 10 at the side of the side electrode 13b. As shown in FIG. 1, those protruding parts are covered by the side electrodes 13a and 13b so as to be buried in the side electrodes 13a and 13b, respectively. Especially, FIG. 1 shows that the entire end portions of the internal electrode layers 11a and 11b protrude to the outer side than the adjacent piezoelectric material layers 10.

Figure 2:
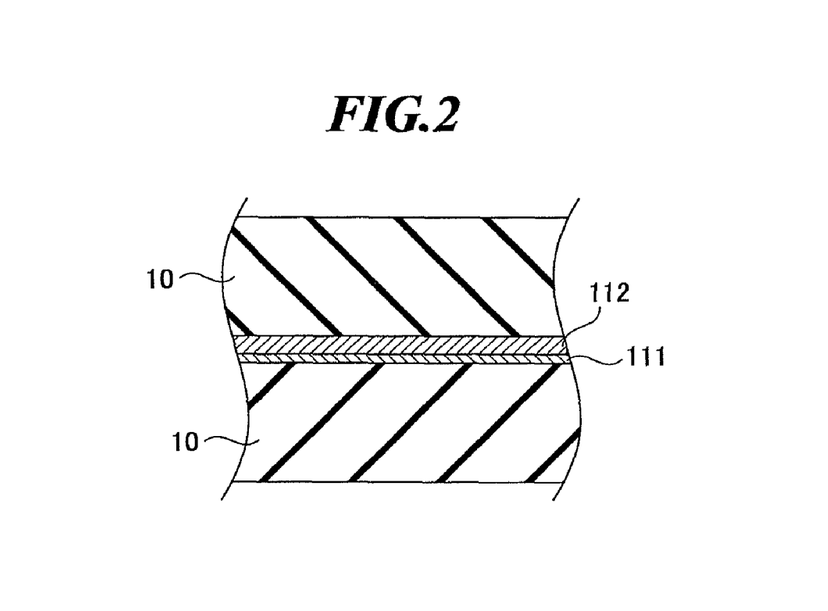
FIG. 2 is a sectional view showing internal electrode layers formed of different plural materials.

Each of the internal electrode layers 11a and 11b may be formed of one kind of material, or may have a multilayer structure formed of different plural materials. As an example of the former case, a metal material such as platinum (Pt) or an alloy (e.g., palladium silver) is used. On the other hand, as an example of the latter case, as shown in FIG. 2, an electrode having a two-layer structure containing an adhesion layer 111 formed of titanium oxide ($TiO_2$) and having a thickness of about 50 nm and a conducting layer 112 formed of platinum (Pt) and having a thickness of about 3 μm is used. By providing the adhesion layer 111, the adhesiveness between the conducting layer 112 and the piezoelectric material layer 10 can be improved.

The side electrode 13a is connected to the internal electrode layers 11a, and insulated from the internal electrode layers 11b by the insulating regions 12b. Further, the side electrode 13b is connected to the internal electrode layers 11b, and insulated from the internal electrode layers 11a by the insulating regions 12a.

The upper electrode 14 is connected to the side electrode 13a, and insulated from the side electrode 13b. Further, the lower electrode 15 is connected to the side electrode 13b, and insulated from the side electrode 13a. Each of the upper electrode 14 and lower electrode 15 may be formed of one kind of material, or may have a multilayer structure containing an adhesion layer and a conducting layer as well as the internal electrodes 11a and 11b.

In the multilayered piezoelectric element, when a voltage is supplied between the upper electrode 14 and lower electrode 15, for example, an electric field is applied to each of the piezoelectric material layers 10. As a result, the multilayered piezoelectric element expands and contracts as a whole due to the piezoelectric effect in each piezoelectric material layer 10. As shown in FIG. 1, the end portions of the internal electrode layers 11a and 11b protruding to the outer side than the piezoelectric material layers 10 are respectively connected to the side electrodes 13a and 13b in broader contact areas than those in the conventional multilayered piezoelectric element as shown in FIG. 7. Thereby, the connection strength increases in the connection portions between them, and the side electrodes 13a and 13b can be prevented from separating from the internal electrode layers 11a and 11b even when each piezoelectric material layer 10 expands and contracts.

Next, a method of manufacturing the multilayered piezoelectric element according to the first embodiment of the present invention will be explained by referring to FIGS. 3A-3C and 4.

Figure 3A:
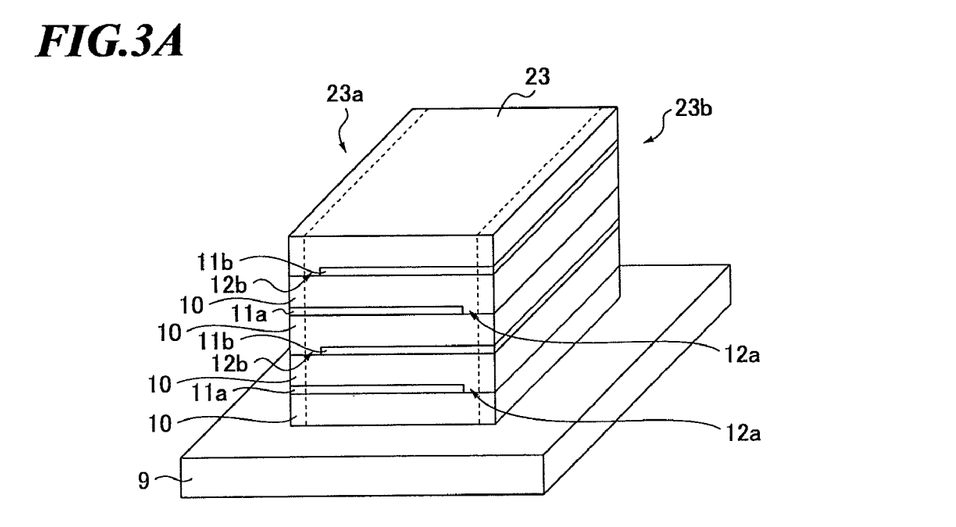
FIGS. 3A-3C are diagrams for explanation of a method of manufacturing the multilayered piezoelectric element according to the first embodiment of the present invention.

First, as shown in FIG. 3A, a multilayered structure 23 is formed by repeating formation of the piezoelectric material layer 10, the internal electrode layer 11a, the piezoelectric material layer 10, and the internal electrode layer 11b in this order on a substrate 9.

Figure 4:
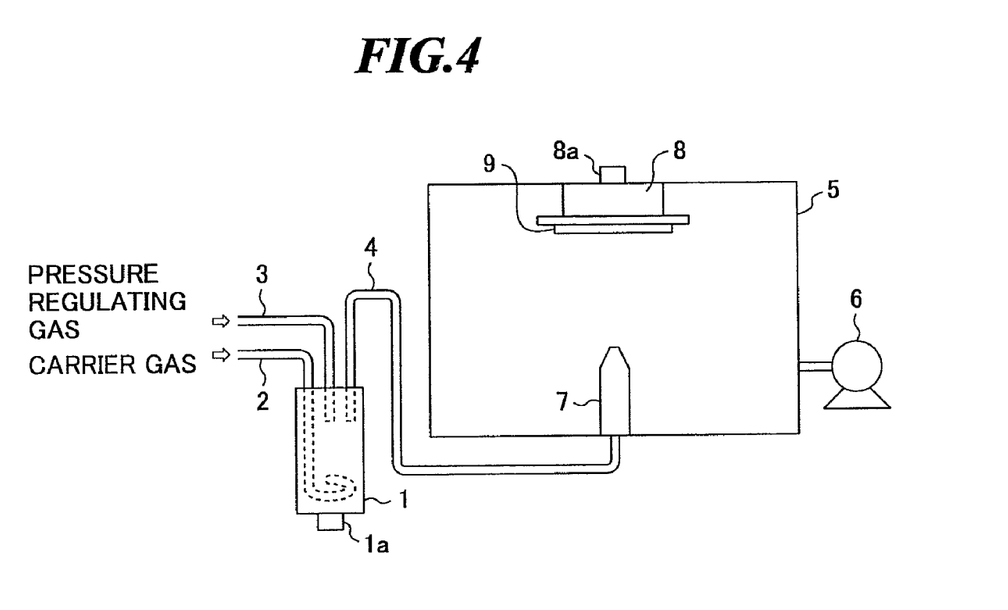
FIG. 4 is a schematic diagram showing a configuration of a film forming apparatus according to an aerosol deposition method.

In the embodiment, the piezoelectric material layers 10 are formed by using an aerosol deposition (AD) method. FIG. 4 is a schematic diagram showing a configuration of a film forming apparatus according to the AD method. The film forming apparatus has an aerosol generation chamber 1, a raising gas nozzle 2, a pressure regulating gas nozzle 3, an aerosol carrier pipe 4, a film formation chamber 5, an exhaust pipe 6, an injection nozzle 7 and a substrate holder 8. The raising gas nozzle 2, the pressure regulating gas nozzle 3 and the aerosol carrier pipe 4 are disposed in the aerosol generation chamber 1.

The aerosol generation chamber 1 is a container in which raw material powder is placed. In the aerosol generation chamber 1, there is provided a container driving unit 1a for agitating the raw material powder placed within the aerosol generation chamber 1 by providing vibration or the like to the aerosol generation chamber 1.

A compressed gas cylinder for supplying a carrier gas is connected to the raising gas nozzle 2 disposed in the aerosol generation chamber 1. The raising gas nozzle 2 generates a cyclonic flow by injecting the gas supplied from the compressed gas cylinder into the aerosol generation chamber 1. Thereby, the raw material powder placed in the aerosol generation chamber 1 is dispersed by the gas and an aerosol is generated.

Further, a compressed gas cylinder for supplying a pressure regulating gas for regulating the gas pressure within the aerosol generation chamber 1 is connected to the pressure regulating gas nozzle 3. By controlling the pressure within the aerosol generation chamber 1 by adjusting the flow rate of the pressure regulating gas, the speed of the air flow (raising gas) generated within the aerosol generation chamber 1 is controlled. As the carrier gas and the pressure regulating gas, nitrogen ($N_2$), oxygen ($O_2$), helium (He) argon (Ar) or dry air is used.

The aerosol carrier pipe 4 disposed in the aerosol generation chamber 1 carries the aerosol containing the raw material powder raised within the aerosol generation chamber 1 to the nozzle 7 disposed in the film formation chamber 5.

The air within the film formation chamber 5 is exhausted by the exhaust pump 6, and thereby, a predetermined degree of vacuum is kept. The injection nozzle 7 disposed within the film formation chamber 5 has an opening having predetermined shape and size, and injects the aerosol supplied from the aerosol generation chamber 1 via the aerosol carrier pipe 4 from the opening toward the substrate 9 at a high speed.

The substrate holder 8 holds the substrate 9. Further, a substrate holder driving unit 8a for moving the substrate holder 8 in a three-dimensional manner is provided to the substrate holder 8. Thereby, the three-dimensional relative position and relative speed between the injection nozzle 7 and the substrate 9 are controlled. By controlling the relative speed, the thickness of a film formed by one reciprocating motion can be controlled.

In such a film forming apparatus, powder of a piezoelectric material as the raw material powder is placed in the aerosol generation chamber 1 and the substrate 9 is set on the substrate holder 8 and kept at predetermined film formation temperature. Then, the substrate is moved at a predetermined speed while the film forming apparatus is driven such that the aerosol is injected from the injection nozzle 7. Thereby, the aerosol (raw material powder) collides with the substrate 9 and cut into the substrate 9 or a structure previously deposited on the substrate 9 (referred to as "anchoring"). Further, the particles bind together on the newly formed active surfaces formed by the deformation or crushing of the raw material powder at the time of collision, and the raw material powder is deposited on the substrate.

In an anchor part (a region formed by anchoring) formed in the boundary region between the film and the substrate or the internal electrode layer as an under layer, thus formed film strongly and closely adheres to the under layer and has an extremely dense structure because of the binding of the particles on the newly formed surfaces (mechanochemical reaction).

Here, when the film formation is performed by using the AD method, as the material of the substrate or the internal electrode layer as the under layer, a material having such hardness that the deformation or crushing of the raw material powder occurs due to the collision is used. This is because, if the hardness of the under layer is insufficient, the raw material powder colliding with the under layer simply cuts into the under layer and is deposited on the under layer without deforming or crushing, and therefore, it becomes impossible to form a dense film by mechanochemical reaction. Accordingly, as the substrate 9, for example, an YSZ (yttrium-stabilized zirconia) substrate, SUS substrate or the like is used.

Referring to FIG. 3A again, the internal electrode layers 11a are formed so as to cross a dicing line as shown by a broken line at the side of a side surface 23a of the multilayered structure and not to reach a dicing line at the side of a side surface 23b of the multilayered structure. Thereby, the insulating regions 12a are provided. Further, the internal electrode layers 11b are formed so as to cross the dicing line as shown by the broken line at the side of the side surface 23b of the multilayered structure and not to reach the dicing line at the side of the side surface 23a of the multilayered structure. Thereby, the insulating regions 12b are provided.

As the material of the internal electrode layers 11a and 11b, a material having ductility and hardness to some degree is used. In the embodiment, ductility is required because the end portions of the internal electrode layers 11a and 11b are protruded to the side surfaces by dicing the multilayered structure 23 as described below. Further, hardness is required because the internal electrode layers 11a and 11b become under layers when the piezoelectric material layers 10 are formed and need sufficient hardness enough to endure the collision of the raw material powder as described above. The property of the material may somewhat differ depending on the dicing condition or the like, and a metal thin film of platinum (Pt), copper (Cu), nickel (Ni) or the like formed by using a film formation technology such as sputtering, plating or the like may be used as the internal electrode layers 11a and 11b. In the embodiment, a platinum thin film formed by sputtering is used.

Figure 3B:
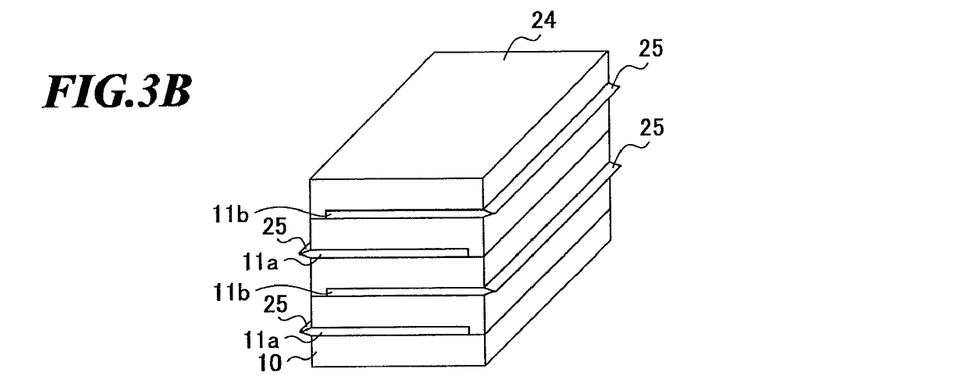

Then, the multilayered structure 23 is diced along the dicing lines as shown in FIG. 3A. Thereby, as shown in FIG. 3B, the end portions 25 of the internal electrode layers 11a and 11b protrude to the outer side than the piezoelectric material layers 10 at the side surfaces of the diced multilayered structure 24. The reason why the end portions 25 protrude is that the internal electrode layers 11a and 11b have higher hardness than that of the piezoelectric material layers 10, and they remains more easily than the piezoelectric material layers 10 when the multilayered structure 24 is cut. At this step, the substrate 9 may be separated from the multilayered structure 24.

Figure 3C:
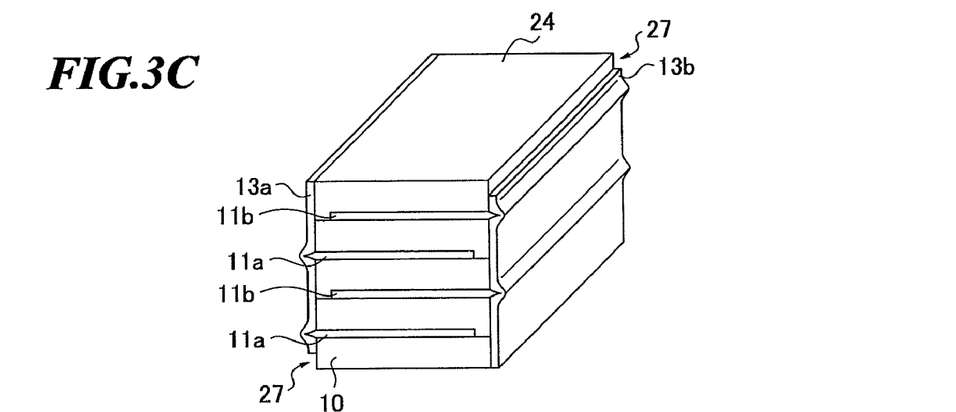

Then, as shown in FIG. 3C, the side electrodes 13a and 13b are formed in the regions other than insulating regions 27 on the side surfaces of the diced multilayered structure 24. The insulating regions 27 are provided for insulting the side electrodes 13a and 13b from the lower electrode layer 15 and the upper electrode layer 14 (FIG. 1), respectively. The side electrodes 13a and 13b are formed by forming a resist mask on the insulating regions 27 and performing sputtering or plating. BY using such a method of forming a film, the side electrodes 13a and 13b can be formed so as to cover the protruding end portions 25.

Further, the upper electrode layer 14 and the lower electrode layer 15 as shown in FIG. 1 may be formed simultaneously with or after the formation of the side electrodes 13a and 13b. As described above, the multilayered piezoelectric element according to the embodiment is completed.

An experiment of fabricating the multilayered piezoelectric element according to the embodiment and separating the side electrodes from the multilayered structure was made. As the internal electrode layer, a two-layer structure containing an adhesion layer of titanium oxide ($TiO_2$) having a thickness of about 50 nm and a conducting layer of platinum (Pt) having a thickness of about 3 μm was formed. Further, as dicing conditions of the multilayered structure, a dicing blade NBC-ZS type manufactured by DISCO CORPORATION was used and the number of revolutions was set to 12,000 rpm.

As a result, the tensile strength of the side electrodes was improved about twice the case of forming the internal electrode layers by screen printing. In the conventional multilayered piezoelectric element, the screen printing is general as a method of forming electrodes. Since the formed electrodes are soft, the end portions of the internal electrode layers do not protrude to the outside from the multilayered part even when the multilayered structure is diced.

Figure 5:
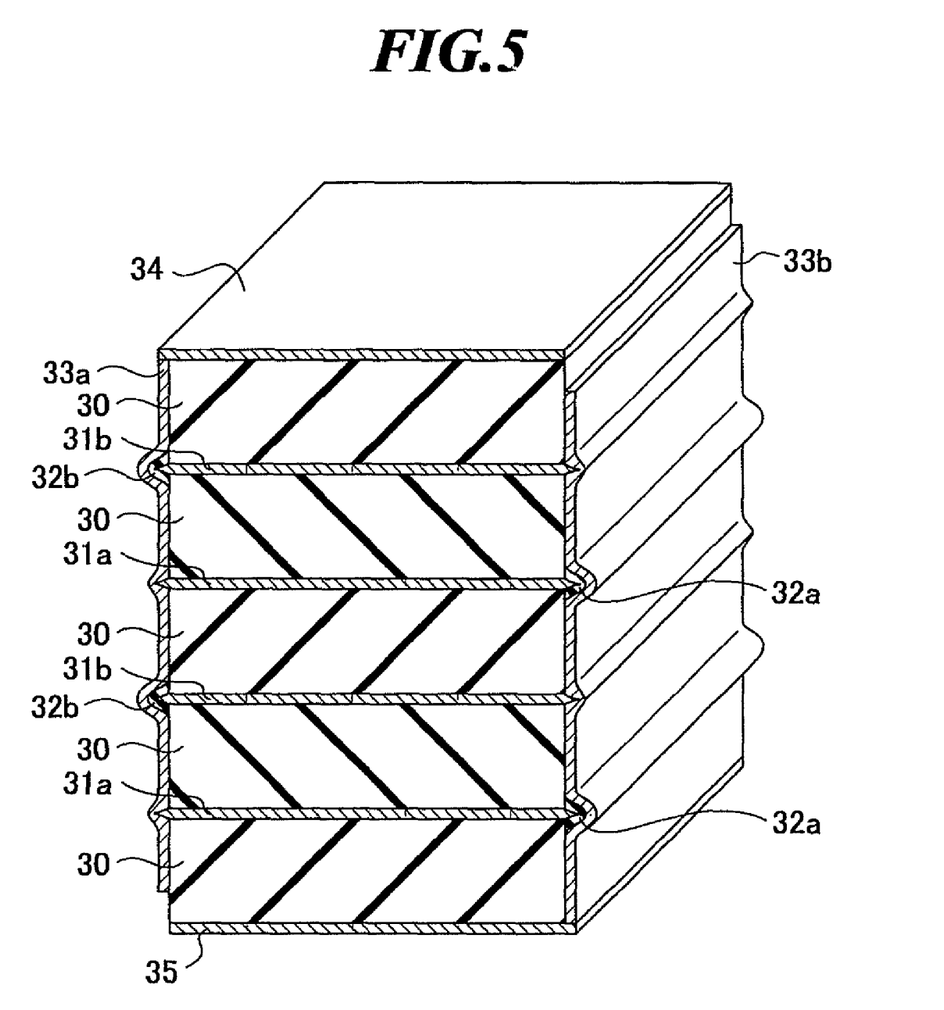
FIG. 5 is a partially sectional perspective view showing a structure of a multilayered piezoelectric element according to the second embodiment of the present invention.

Next, a multilayered piezoelectric element according to the second embodiment of the present invention will be explained. FIG. 5 is a partially sectional perspective view showing a structure of the multilayered piezoelectric element according to the second embodiment.

The second embodiment is different from the first embodiment in the point where the internal electrode layers are insulated from the side electrodes by covering the end portions of the internal electrode layers with insulating films, while the internal electrode layers are insulated from the side electrodes by providing the insulating regions in the first embodiment.

As shown in FIG. 5, the multilayered piezoelectric element according to the embodiment has (i) a multilayered structure including plural piezoelectric material layers 30, at least one internal electrode layer 31a and at least one internal electrode layer 31b, (ii) insulating films 32a and 32b formed on the first and second side surfaces of the multilayered structure, respectively, and (iii) side electrodes 33a and 33b further formed thereon. Generally, the multilayered piezoelectric element further has an upper electrode layer 34 and a lower electrode layer 35.

The at least one internal electrode layer 31a and the at least one internal electrode layer 31b are alternately stacked with the piezoelectric material layer 30 therebetween. Here, the internal electrode layers 31a and 31b are formed on the entire surfaces of the piezoelectric material layers 30. Further, at last a part of the end portions of the internal electrode layers 31a and 31b protrude to the outer side than the adjacent piezoelectric material layers 30 at the sides of the side electrodes 33a and 33b. FIG. 5 shows that the entire end portions of the internal electrode layers 31a and 31b protrude to the outer side than the adjacent piezoelectric material layers 30.

At the side of the side electrode 33a, the end portions of the internal electrode layers 31a are covered so as to be buried in the side electrode 33a, while the insulating films 32b are formed so as to cover the end portions of the internal electrode layers 31b. Similarly, at the side of the side electrode 33b, the end portions of the internal electrode layers 31b are covered so as to be buried in the side electrode 33b, while the insulating films 32a are formed so as to cover the end portions of the internal electrode layers 31a.

By thus forming the insulating films 32a and 32b, the side electrodes 33a are connected to the internal electrode layers 31a, and insulated from the internal electrode layers 31b. On the other hand, the side electrodes 33b are connected to the internal electrode layers 31b, and insulated from the internal electrode layers 31a.

In the embodiment, the side electrodes 33a and 33b or insulating films 32a and 32b are formed on the end portions of the internal electrode layers 31a and 31b that protrude to the outer side than the adjacent piezoelectric material layers 30, respectively, and therefore, the contact areas between the internal electrode layers and the side electrodes or insulating films become broader. As a result, the contact strength between them increases, and the side electrodes 33a and 33b or insulating films 32a and 32b can be prevented from separating from the internal electrode layers 31a and 31b even when the piezoelectric material layers 30 expand and contract when the piezoelectric element is driven.

Next, a method of manufacturing the multilayered piezoelectric element according to the second embodiment of the present invention will be explained by referring to FIGS. 6A-6D.

Figure 6A:
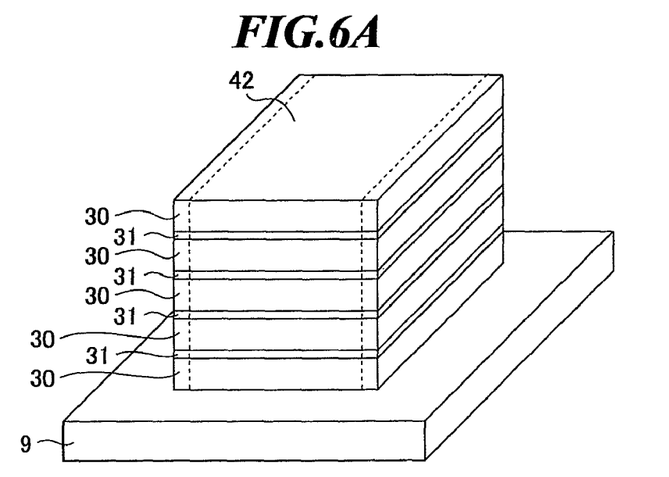
FIGS. 6A-6D are diagrams for explanation of a method of manufacturing the multilayered piezoelectric element according to the second embodiment of the present invention.

First, as shown in FIG. 6A, a multilayered structure 42 is formed by alternately stacking the piezoelectric material layers 30 and the internal electrode layers 31 on the substrate 9. The piezoelectric material layers 30 are formed by using the AD method as well as in the first embodiment. Further, the internal electrode layers 31 are formed by employing the same material as that explained in the first embodiment by sputtering or plating.

Figures 6B, 6C:
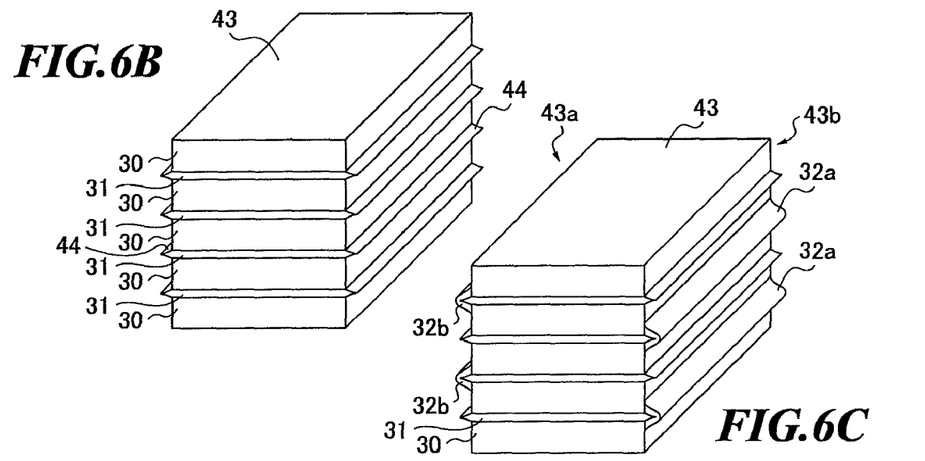

Then, the multilayered structure 42 is diced along dicing lines as shown in FIG. 6A. Thereby, as shown in FIG. 6B, a shaped multilayered structure 43 is obtained. End portions 44 of the internal electrode layers 31 protruding to the outer side than the piezoelectric material layers 30 are formed at the side surfaces of the diced multilayered structure 43. At this step, the substrate 9 may be separated from the multilayered structure 43.

Then, as shown in FIG. 6C, the insulating films 32a are formed so as to cover every other end portion 44 of the internal electrode layers 31 on the side surface 43b of the diced multilayered structure 43. Further, the insulating films 32b are formed so as to cover every other end portion 44 of the internal electrode layers 31 on the side surface 43a of the diced multilayered structure 43. Here, the insulating films 32a and 32b are formed in a staggered manner. The internal electrode layers 31 having the end portions 44 covered by the insulating films 32a correspond to internal electrode layers 31a as shown in FIG. 5, while the internal electrode layers 31 having the end portions 44 covered by the insulating films 32b correspond to internal electrode layers 31b as shown in FIG. 5.

These insulating films 32a and 32b are formed by attaching glass powder having a softening point of, for example, about 500° C. to about 700° C. to the end portions 44 by electrophoresis (electrode position), or depositing paste containing glass powder onto the end portions 44 by screen printing. Alternatively, the insulating films 32a and 32b may be formed according to the AD method by spraying an aerosol in which powder of an insulating material is dispersed toward the end portions 44 of the internal electrode layers 31.

Figure 6D:
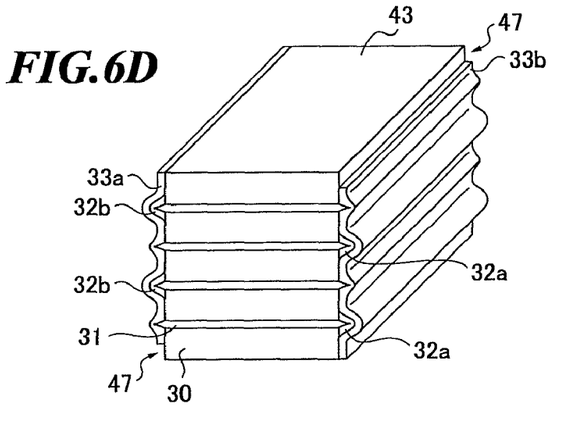

Then, as shown in FIG. 6D, the side electrodes 33a and 33b are formed in the regions other than insulating regions 47 on the side surfaces of the diced multilayered structure 43 by sputtering or plating. Furthermore, the upper electrode layer 34 and lower electrode layer 35 as shown in FIG. 5 may be formed. As described above, the multilayered piezoelectric element according to the embodiment is completed.

The above explained multilayered piezoelectric elements according to the first and second embodiments are used as piezoelectric pumps, piezoelectric actuators, ultrasonic transducers for transmitting and receiving ultrasonic waves in an ultrasonic probe, and so on. In this regard, a multilayered piezoelectric element may be singly used, or multilayered piezoelectric elements may be arranged in a one- or two-dimensional manner for use as a piezoelectric element array.

The invention claimed is:

1. A method of manufacturing a multilayered piezoelectric element having a multilayered structure in which at least one first electrode layer and at least one second electrode layer are alternately stacked with a piezoelectric material layer therebetween, said method comprising the steps of:
   (a) forming a first piezoelectric material layer;
   (b) forming a first electrode layer on said first piezoelectric material layer except for a first predetermined region;
   (c) forming a second piezoelectric material layer on said first electrode layer;
   (d) forming a second electrode layer on said second piezoelectric material layer except for a second predetermined region;
   (e) forming a third piezoelectric material layer on said second electrode layer;
   (f) forming a first side surface and a second side surface by dicing the formed multilayered structure to protrude at least a part of an end portion of said first electrode layer to an outer side than adjacent piezoelectric material layers on the first side surface and secure a first insulating region between said first electrode layer and the second side surface, and to protrude at least a part of an end portion of said second electrode layer to an outer side than adjacent piezoelectric material layers on the second side surface and secure a second insulating region between said second electrode layer and the first side surface;
   (g) forming a first side electrode, which is connected to the at least a part of the end portion of said first electrode layer and insulated from said second electrode layer by said second insulating region, on the first side surface of said multilayered structure; and
   (h) forming a second side electrode, which is connected to the at least a part of the end portion of said second electrode layer and insulated from said first electrode layer by said first insulating region, on the second side surface of said multilayered structure.

2. The method according to claim 1, wherein each of steps (a), (c) and (e) includes forming respective one of said first to third piezoelectric material layers according to an aerosol deposition method by spraying powder of a piezoelectric material toward respective one of a substrate, said first electrode layer and said second electrode layer, and depositing the piezoelectric material thereon.

3. The method according to claim 1, wherein each of steps (b) and (d) includes forming respective one of said first electrode layer and said second electrode layer by one of sputtering and plating.

4. The method according to claim 1, wherein each of steps (b) and (d) includes forming respective one of said first electrode layer and said second electrode layer by disposing a conducting layer via an adhesion layer on respective one of said first piezoelectric material layer and said second piezoelectric material layer.

5. A method of manufacturing a multilayered piezoelectric element having a multilayered structure in which at least one first electrode layer and at least one second electrode layer are alternately stacked with a piezoelectric material layer therebetween, said method comprising the steps of:
   (a) forming a first piezoelectric material layer;
   (b) forming a first electrode layer on said first piezoelectric material layer;
   (c) forming a second piezoelectric material layer on said first electrode layer;
   (d) forming a second electrode layer on said second piezoelectric material layer;
   (e) forming a third piezoelectric material layer on said second electrode layer;
   (f) forming a first side surface and a second side surface by dicing the formed multilayered structure to protrude at least a part of an end portion of each of said first and second electrode layers to an outer side than adjacent piezoelectric material layers on each of the first and second side surfaces;
   (g) forming a first insulating film on the second side surface of said multilayered structure to cover the end portion of said first electrode layer;
   (h) forming a second insulating film on the first side surface of said multilayered structure to cover the end portion of said second electrode layer;
   (i) forming a first side electrode, which is connected to the at least a part of the end portion of said first electrode layer and insulated from said second electrode layer by said second insulating film, on the first side surface of said multilayered structure; and
   (j) forming a second side electrode, which is connected to the at least a part of the end portion of said second electrode layer and insulated from said first electrode layer by said first insulating film, on the second side surface of said multilayered structure.

6. The method according to claim 5, wherein each of steps (a), (c) and (e) includes forming respective one of said first to third piezoelectric material layers according to an aerosol deposition method by spraying powder of a piezoelectric material toward respective one of a substrate, said first electrode layer and said second electrode layer, and depositing the piezoelectric material thereon.

7. The method according to claim 5, wherein each of steps (b) and (d) includes forming respective one of said first electrode layer and said second electrode layer by one of sputtering and plating.

8. The method according to claim 5, wherein each of steps (b) and (d) includes forming respective one of said first electrode layer and said second electrode layer by disposing a conducting layer via an adhesion layer on respective one of said first piezoelectric material layer and said second piezoelectric material layer.

9. The method according to claim 5, wherein each of steps (g) and (h) includes forming respective one of said first insulating film and said second insulating film according to an aerosol deposition method by spraying powder of an insulating material toward respective one of the end portion of said first electrode layer and the end portion of said second electrode layer, and depositing the insulating material thereon.

10. The method according to claim 5, wherein each of steps (g) and (h) includes forming respective one of said first insulating film and said second insulating film by electrodeposition.

* * * * *